United States Patent [19]

Linde

[11] Patent Number: 4,968,552
[45] Date of Patent: Nov. 6, 1990

[54] VERSATILE REACTIVE ION ETCH BARRIERS FROM POLYAMIC ACID SALTS

[75] Inventor: Harold G. Linde, Richmond, Vt.

[73] Assignee: International Business Machines Corp., Armonk, N.Y.

[21] Appl. No.: 421,219

[22] Filed: Oct. 13, 1989

[51] Int. Cl.[5] .................. B44C 1/22; B29C 37/00; B32B 3/00; H01L 21/306

[52] U.S. Cl. .................. 428/195; 156/628; 156/643; 156/646; 156/657; 156/659.1; 156/668; 156/904; 204/192.36; 252/79.1; 427/38; 427/43.1; 428/199; 430/299; 430/313

[58] Field of Search .................. 252/79.1; 204/192.32, 204/192.35, 192.36, 192.37; 427/38, 39, 43.1; 430/313, 317, 318, 299; 156/628, 635, 643, 646, 653, 655, 656, 657, 659.1, 668, 904; 428/192, 195, 199, 201, 209

[56] References Cited

U.S. PATENT DOCUMENTS

| 4,092,209 | 5/1978 | Ipri .................. 156/628 |
| 4,377,734 | 3/1983 | Mashiko et al. .................. 219/121 |
| 4,430,153 | 2/1984 | Gleason et al. .................. 156/643 |
| 4,505,574 | 3/1985 | Meyer et al. .................. 430/331 |
| 4,600,686 | 7/1986 | Meyer et al. .................. 156/628 |
| 4,613,398 | 9/1986 | Chiong et al. .................. 156/628 |
| 4,692,205 | 9/1987 | Sachdev et al. .................. 156/643 |
| 4,751,170 | 6/1988 | Mimura et al. .................. 156/628 X |
| 4,803,181 | 2/1989 | Buchmann et al. .................. 156/628 X |

OTHER PUBLICATIONS

Linde, H.–Journal of Polymer Science (Polymer Physics Ed.), 26, pp. 1485–1497 (1989).

*Primary Examiner*—William A. Powell
*Attorney, Agent, or Firm*—Perman & Green

[57] ABSTRACT

The present invention provides a novel approach to forming a RIE etch barrier in processes where thermally stable polymeric materials containing free carboxyl groups, such as polyamic acid polymers, are present as masking layers in the electrical device to be fabricated. The present process takes advantage of the discovery that polyamic acids complex with certain metallic cations under slightly acidic conditions to form polyamic acid salts. These salts can be made to further react with a variety of etching gases to form a nonvolatile salt or oxide which imparts etch barrier properties to that portion of the polyamic acid layer exposed to the metallic cations.

17 Claims, 2 Drawing Sheets

4,968,552

VERSATILE REACTIVE ION ETCH BARRIERS FROM POLYAMIC ACID SALTS

BACKGROUND OF THE INVENTION

1. Field of the Invention

This invention relates to a method of forming an etch barrier from polyamic acid films during the reactive ion etching of substrate surfaces in the manufacture of semiconductor elements.

2. Description of Related Art

The technique of plasma or reactive ion etching (RIE) is well known and commonly used in the manufacture of semiconductor devices.

A mask or a patterned photosensitive resist is formed over a substrate material such as a silicon wafer or metallic substrate, and the non-masked areas of the substrate are etched by contact with an etching gas such as oxygen in an electric field. Removal of the mask or the remaining resist yields a pattern etched into the surface of the substrate.

Many large scale integrated circuit devices employ a thin film of a polyimide or polyamic acid polymer overlaying the substrate. This layer may serve many functions such as a dielectric layer, a passivation layer to separate or overcoat metallurgy, or as a lift off layer as disclosed in U.S. Pat. No. 4,692,205. In many applications, the polyamic acid layer serves as a masking layer for RIE processes and therefore means must be found to enhance the etch resistance of the polyamic acid film surface which is not to be etched during the etching process.

The most common masking technique used to prepare relief images involves the use of a photosensitive resist material which is exposed to a pattern of radiation and developed to yield an image pattern. Radiation sensitive resists are classified as positive or negative acting. When a positive acting resist is exposed to radiation, the exposed parts can be removed selectively because they become soluble in a developing solution with the unexposed parts remaining insoluble. In the case of a negative acting resist, the exposed parts become insoluble while the unexposed parts remain soluble. In general positive acting resists allow better resolution than their negative acting counterparts. Thus, because of their compatibility with miniaturization, the semiconductor industry has tended to prefer positive acting resists for the manufacture of integrated circuits despite the fact that their resistance to plasma etching is generally inferior to negative acting resists. To counteract the problem of poor etch resistance, it is usual to use a relatively thick layer (typically in the range 0.5 to 1 micrometer) of resist in order to compensate for undesirable erosion but, unfortunately, resolution is reduced as the resist thickness increases.

Most prior art attempts to improve resolution involve the treatment of the resist material itself to improve its resistance to plasma gases, i.e., to enhance its barrier or masking properties. For example, U.S. Pat. No. 4,504,574 discloses a method forming a resist mask resistant to plasma etching by first subjecting a lithographically patterned layer of resist on a substrate to a carbon monoxide plasma treatment followed by a more conventional plasma etch.

U.S. Pat. No. 4,430,153 discloses a method of forming an RIE etch barrier involving converting the top layer of an aromatic polyimide to the corresponding silicon containing polyimide, overcoating that layer with a patterned resist, reactive ion etching the exposed surface and reacting the thus exposed surface of the silicon containing polyimide with oxygen reactive ion etching thereby forming a silicon dioxide barrier layer. A somewhat related process is disclosed in U.S. Pat. No. 4,692,205 wherein a silicon-containing polyimide layer is employed as an oxygen etch barrier in a metal lift-off process.

Other techniques for improving etch resistance involve treating substrates with etch resistant ionic materials. For example, U.S. Pat. No. 4,377,734 discloses a method of forming an etched pattern on a substrate such as silicon or aluminum wherein the substrate is first subjected to a patterned ion bombardment with a metal ion, such as tungsten, which form a passivator against subsequent ion etching. U.S. Pat. No. 4,092,209 discloses a method for rendering silicon substantially non-etchable by potassium hydroxide comprising bombarding the surface of the silicon with phosphorous ions.

While these and other techniques for imparting etch resistance to various substrates are suitable for their intended purposes, they are limiting with respect to the specific chemistry involved. For example, the masking processes disclosed in U.S. Pat. Nos. 4,430,153 and 4,692,205 wherein etch resistance is imparted to a silicon-containing polyimide requires the use of an oxygen-containing plasma in the etch step which converts the silicon into the more etch resistant silicon dioxide. Non-oxidizing etchants based on other chemistry, such as halogen gas etchants, would not appear to be useful in such a system. In addition, modification of resist materials prior to etching in order to improve etch resistance may involve a number of additional process steps and/or the use of noxious materials, and may render the resist more difficult to remove from the substrate.

SUMMARY OF THE INVENTION

The present invention provides a novel approach to forming an RIE etch barrier in processes where thermally stable polymeric materials containing functional groups capable of reacting with metal ions, such as polyamic acid polymers, are present as masking layers in the electrical device to be fabricated. The present process takes advantage of Applicant's discovery that polyamic acids complex with certain metallic cations under slightly acidic conditions to form polyamic acid salts, as disclosed in the Journal of Polymer Science (Polymer Physics Edition) 26, pp. 1485–1497, 1989. It has now been discovered that these salts can be made to further react with a variety of etching gases to form a non-volatile salt or oxide which imparts etch barrier properties to that portion of the polyamic acid layer exposed to the metallic cations.

In accordance with the process of this invention, an aromatic polyamic acid layer is first formed on a desired substrate. Typically, the substrate is a passivating or dielectric layer, such as a polyimide, or an inorganic substrate such as Si, $SiO_2$, $Si_3N_4$, a metal, a silicide or the like. Next, a layer of photoresist is applied to the polyamic acid layer, and it is exposed and developed to selectively expose portions of the polyamic acid layer. Then, the exposed portions of the polyamic acid layer are contacted with an aqueous solution containing cations, such as alkaline earth, transition metal or heavy metal ions, e.g. calcium, magnesium, lead, copper, nickel, cobalt, silver and the like, under slightly acidic conditions (e.g., at about 3.5 § pH § 7). The cations are incorporated into the selected portions of the polyamic acid layer via diffusion and ion exchange reaction. This is followed by reactive ion etching of the resulting structure with the etch gas reacting with the incorporated cations present on the polyamate surface to form a non-volatile material such as a salt or oxide, which is resistant to etching. Non-masked areas of the polyamic acid layer and underlying substrate are etched away thereby generating a relief structure. The present invention allows the incorporation of a broad range of metal cations into the polyamic acid layer, with a resulting wide choice of etch gases.

DESCRIPTION OF THE PREFERRED EMBODIMENTS

Figure 1:
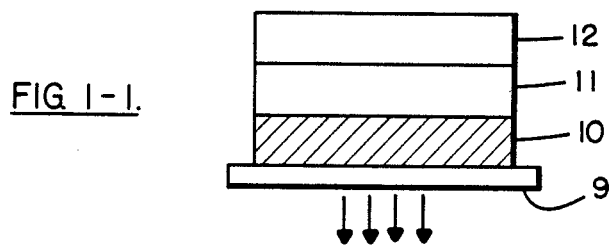
FIGS. 1-1 through 2-9 are process flow diagrams showing cross-sectional views of the subsequent stages in the formation of a plasma etch-resistant mask on a polymer substrate or surface using the method in accordance with this invention. Thicknesses of the various layers shown in the drawings are not to scale.

Referring to FIG. 1-1, a substrate 10 such as silicon is coated with a passivation or dielectric polymer layer 11 which, in the preferred embodiment, contains free carboxyl groups, and this layer is further overcoated with a resist material 12. An additional underlying substrate layer 9 is also provided. This layer may be composed of the same or similar material as layer 10 or may be composed of a different material such as metal, silicon oxide or an insulating dielectric polymer such as a cured epoxy resin or a cured polyimide resin.

Figures 1, 2:
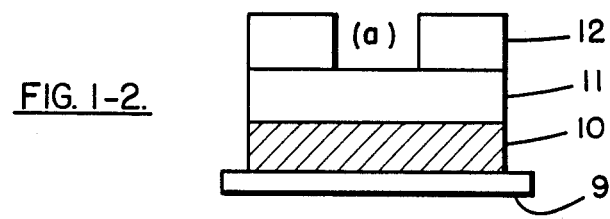

In FIG. 1-2, the resist layer has been exposed and developed yielding interconnect zone (a), at the base of which is the exposed surface of the polymeric layer 11.

Figures 1, 2, 3:
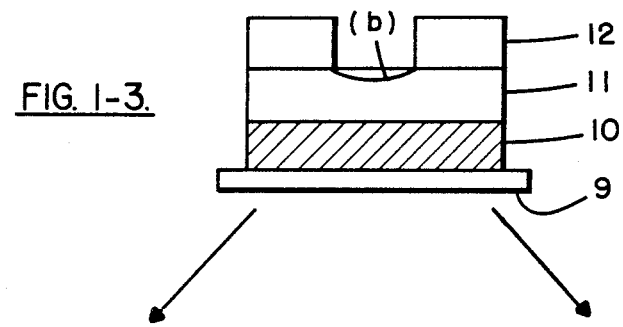
Figures 1, 2, 3, 4:
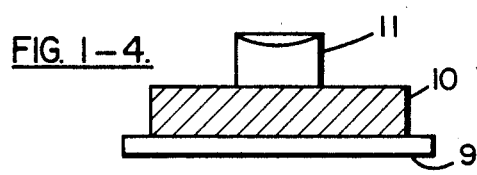
Figures 1, 2, 3, 4, 5, 6:
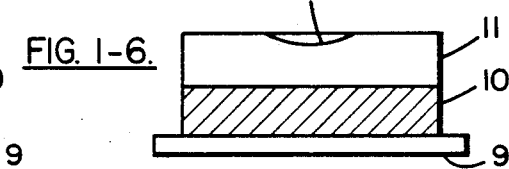
Figures 1, 2, 3, 4, 5:
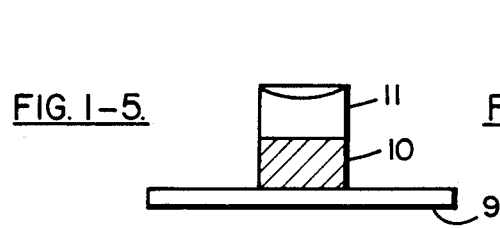
Figures 1, 2, 3, 4, 5, 6, 7:
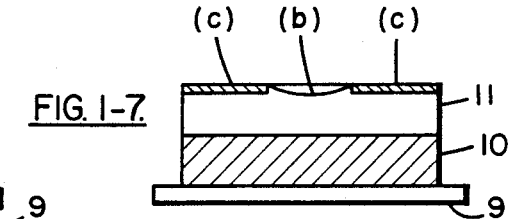
Figures 1, 2:
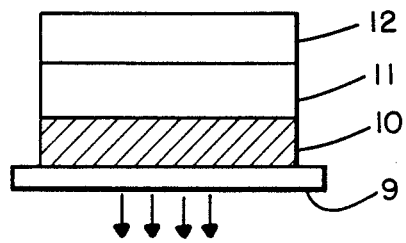
Figure 2:
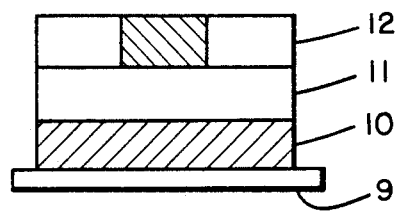
Figures 2, 3:
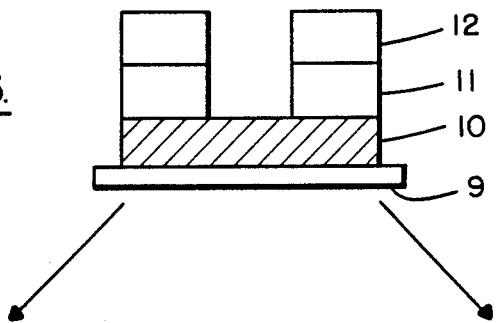
Figures 2, 3, 4:
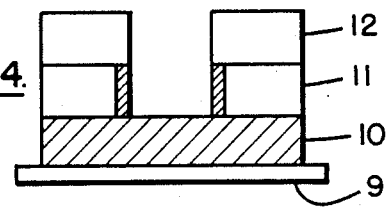
Figures 2, 3, 4, 5, 6, 7:
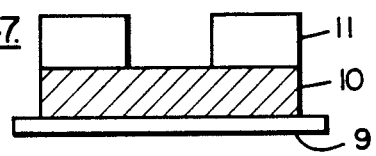
Figures 2, 3, 4, 5:
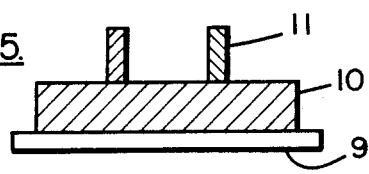
Figures 2, 3, 4, 5, 6, 7, 8:
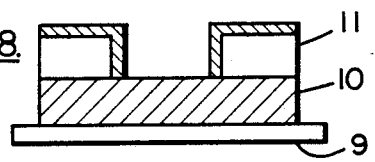
Figures 2, 3, 4, 5, 6:
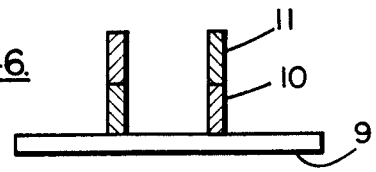
Figures 2, 3, 4, 5, 6, 7, 8, 9:
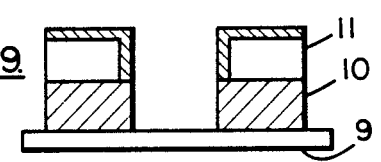

In one of the preferred embodiments of the invention, the structure is next contacted with an aqueous solution containing cations under slightly acidic conditions which cations are incorporated into the polymer layer via diffusion and ion exchange to form a polymer salt in region (b) as shown in FIG. 1-3.

The structure is then subjected to an RIE plasma etch treatment which etches away the remaining resist, the unmasked regions of polymer and the underlying support, while leaving behind the masked polymer relief structure as shown in FIGS. 1-4 and 1-5.

The substrates 10 and 9 may be essentially any material commonly employed in the fabrication of electrical and semiconductor devices. Suitable substrates include metals such as aluminum, chromium, copper or silver; silicon materials such as silicon dioxide, silicon nitride, phosphorous doped silicon dioxide and monocrystalline silicon; and polymeric materials such as dielectric polyimides or polyepoxides.

Polymeric materials which comprise layer 11 include those polymers having superior thermal and insulating properties and also containing functional groups capable of reacting with selected cations, such as carboxylic or sulfonic acid groups. Preferred functional groups are carboxylic acid groups. Such polymers include epoxy resins, polyamic acid polymers, polymers containing acid anhydride groups, as well as polyimides containing free carboxyl groups. Especially preferred are polyamic acid polymers which are based on the condensation of aromatic dianhydrides with diamines, more preferably aromatic diamines. Suitable aromatic dianhydrides include pyromellitic dianhydride, 2,2-bis(3,4-dicarboxyphenyl) propane dianhydride, 2,3,6,7-naphthalene tetracarboxylic dianhydride, 2,2',3,3'-diphenyl tetracarboxylic dianhydride, benzophenone tetracarboxylic dianhydride, and fluorinated materials such as 2,2-hexafluoro-bis (3,4-dicarboxyphenyl) propane dianhydride. Suitable diamines include m-phenylene diamine, p-phenylene diamine, 4,4'-diaminodiphenyl ether as well as fluorinated diamines such as 2,2-hexafluoro-bis (4-aminophenyl) propane. The polyamic acids may be partially imidized such as by heat or chemical cyclization as a method for controlling the number of free acid groups present in the polymer molecule, but not to the extent that an unsuitable number of free carboxyl groups remain available to complex with the metal ions contacted therewith.

Suitable polyamic acids useful for the purposes of this invention generally have glass transition temperatures (Tg) in excess of 200° C. and their methods of preparation are disclosed in U.S. Pat. Nos. 3,179,614, 3,264,250 and 3,310,573, the disclosure of which references is incorporated herein by reference. Particularly preferred polyamic acid polymers are available from the DuPont Company under the trade designation RC-5878 and PI 5057.

Polyamic acid layer 11 may be formed in any conventional fashion. Typically it is applied by spin coating a solution of the polymer dissolved in suitable inert solvent such as N-methylpyrrolidone and dried. The layer may be partially cured by heating at temperatures in the order of 100° to 150° C. for about 5 to 20 minutes. Thicknesses of the dried layer are not unduly limited, but typically will be in the order of from about 0.05 to about 2 microns.

Resist layer 12 may be standard resist materials known in the art and may be positive acting or negative acting. The resists may be sensitive to near, mid and deep UV, electron beam, x-ray, ion beam or laser. Examples of such resists include novolak based resists containing light sensitive diazoquinone compounds such as disclosed in U.S. Pat. No. 4,550,069 or the so called blocked resists based on copolymers containing blocked imide groups and a latent photoacid, such as disclosed in U.S. Pat. No. 4,810,613. Also suitable are negative resists which contain photosensitive crosslinking agents or photopolymers such as disclosed in U.S. Pat. No. 3,469,982 and Re 30,186. The resist selected generally can be removable by conventional reactive ion etching processes.

The resist layer 12 may be applied by any suitable process such as spin coating from solution followed by drying. The thickness of the dried resist may generally be of the same magnitude as the thickness of the polyamic acid layer, i.e. from about 0.05 to about 2 microns.

Image patterns are formed on the surface of polyamic acid layer 11 by exposing resist layer 12 through a mask followed by the usual development to remove the exposed or unexposed areas of the resist, depending on resist chemistry. The development step exposes that portion of the polyamic acid layer surface to be complexed with cations in accordance with this invention, while the remaining portions of the surface continue to be masked by the resist as illustrated in FIG. 1-2. Positive resist materials are preferred for this invention since they may be developed using aqueous alkaline developer materials. Preferred developers comprise aqueous solutions of tetramethyl ammonium hydroxide, potassium hydroxide or sodium meta silicate. Calcium hydroxide may also be used in certain applications.

The next stage of the process involves contacting the patterned surface prepared as above with an aqueous solution containing alkaline earth, transition metal or heavy metal cations in order that these cations may complex to form polyamate salts by diffusion and ion exchange with the free acid groups present in polymer layer 11, the patterned surface of which is exposed at interconnect zone (a) shown in FIG. 1-2. Free cations may be generated in aqueous solutions of metallic salts, such as nitrates, halides, sulfates and the like as well as mixtures thereof. Suitable metal ions include alkaline earth metals of Group II A of the Periodic Table such as calcium, magnesium, barium, and strontium; heavy metals such as lead, cobalt and zinc; Group 1B metals such as copper and silver; and transition metals such as nickel, titanium, chromium and manganese. Ionically impure tap water may also be employed as the source of cations, generally yielding a mixed calcium/magnesium salt. In general, any cation which is capable of complexing with the polyamic acid and will form salts or oxides when the complexed polyamic acid surface is subjected to an RIE etch treatment are operable for the purposes of this invention.

The aqueous ionic solution may be prepared by dissolving the metallic compound in water to form a dilute solution. The cationic concentration in the solution is generally not critical, but 0.01 to 0.2 molar solutions are preferred. The lower the cationic concentration, the longer the time required for the cations to complex with the polyamic acid.

If necessary, the pH of the solution should be adjusted to fall in a range of from at least about 3.5 up to about 7.0. At a low pH, below about 3.5, the cations are not effectively absorbed into the surface of the polyamic acid film layer and the polymer acid groups remain substantially unneutralized; at a higher pH of greater than about 7.0, the ionic solution tends to dissolve the polyamic acid layer. The pH adjustment may be accomplished by adding appropriate amounts of an acid to the aqueous solution, the preferred acids being weak acids such as acetic or phosphoric.

The polyamic acid/ion salt complexes may be formed by simply contacting the exposed surface of polyamic acid layer 11 shown in FIG. 1-2 with the aqueous cationic solution at room temperature. Contact may be accomplished by simple application of the solution to the surface by spraying, or pouring, or by immersion of the structure into the solution. Generally, the ion exchange and diffusion reaction will take place in a very short period of time, generally from about 30 seconds to about 5 minutes of contact time. After the reaction is complete, the structure is washed and dried to yield the modified barrier surface region shown as (b) in FIG. 1-3.

A particular advantage of the process of this invention is that it also provides a method for patterning conductive metallic layers on the surface of polyamic acid substrates. For example, cations of highly conductive metals such as silver may be diffused onto selective portions of the polyamic acid layer to form a silver rich polyamate surface, which when reduced by heating to about 350° C., forms a conductive silver rich line pattern on the surface.

Next, the structure is subjected to an RIE plasma etch treatment which etches away the remaining resist area as well as the unmasked portions of the polyamic acid layer leaving the masked portions of the polyamic acid layer intact and capable of acting as an etch barrier for the underlying substrate as shown in FIG. 1-4. Continuation of the etch process etches away the exposed substrate 10 as shown in FIG. 1-5.

One of the main advantages of the present invention is that etching may be accomplished using a wide variety of etching gases, the main criteria of such gases being that they are capable of etching away the non-masked areas of the relief structure while leaving the masked area behind as shown in FIG. 1-4 and 1-5, and be reactive with the cation polyamate salt present in the selected portions of the polyamic acid layer to form cationic salts or oxides which are resistant to etching. The step of subjecting the substrate to gaseous plasma etch results in the in-situ formation of an etching mask as a consequence of the reaction between the gas and the cation rich polyamate salt.

Etching may be carried out in a reactive ion etch reactor using standard wattage such as from about 100 to about 1,000 watts, standard gas flow rates and standard pressures, as are known in the prior art.

Etching gases which may be employed include oxygen and mixtures of oxygen with inert gases such as argon or nitrogen. Gases based on halogen and halogen-containing compounds may also be employed, alone or in admixture with oxygen or an inert gas. Preferred halogen containing compounds generally contain not more the 2 carbon atoms and include $CX_4$, $C_2X_6$, $CFCl_3$, $CF_3CL$, $SX_6$, $CCL_2F_2$ and $NX_3$, wherein X is halogen, preferably chlorine or fluorine. Other gases which may be used include nitrous oxide, carbon dioxide and carbon monoxide, as well as sulfur containing gasses such as carbon disulfide. The process of this invention essentially permits the selection of any etchant reactive with the polyamate cations to produce salts, such as halogen salts, or to produce metal oxides or sulfides, all of which are significantly more resistant to etching than the photoresist and unmodified polyamic acid layers, as well as the underlying substrate layer.

It is to be pointed out that some cation species may be non-reactive with some species of etching gas such that some routine experimentation by one skilled in the art may be required to match the proper etch gas to the appropriate cation species to produce the barrier salts or oxides. For example, test data shows that calcium ions do not sufficiently react with oxygen gas under etching conditions to provide appropriate barrier properties, whereas calcium is sufficiently reactive with halogen-containing gases to produce such properties.

The following examples are illustrative of the invention.

EXAMPLE 1

A polyamic acid solution based on the condensation product of pyromellitic dianhydride and 4,4'-diaminodiphenyl ether (available from du Pont Corporation under the trade designation RC-5878), 16% solids in N-methyl pyrrolidone, was spin coated at 4000 rpm onto a silicon wafer substrate and this structure was baked at 120° C. for 15 minutes yielding a nominal film thickness of about 5000 angstroms.

Next, a positive-acting photoresist composition based on a solution of a novalak resin and a diazoquinone sensitizer (AZ-1350J, available from Hoechst Celanese Corporation) was spun coated over the dried polyamic acid film and the structure was baked at 90° C. for 2 minutes.

The resist layer was then exposed through a line mask to a mercury gas lamp under standard conditions for a time sufficient to photochemically alter that portion of the resist film exposed to the light. Exposure was followed by contact with an aqueous 5% by weight tetramethylammonium hydroxide solution for about 50 seconds to develop the positive image in the resist layer only. The wafer was then dipped in a 0.5% aqueous solution of acetic acid for 2–3 minutes to neutralize any residual base. The cross sectional configuration of the structure at this stage is as depicted in FIG. 1-2.

The patterned wafer was then dipped in a 0.1 M aqueous solution of copper nitrate (pH about 5) for 2 minutes, after which it was briefly rinsed with deionized tap water and dried. At this point the structure has the cross sectional configuration depicted in FIG. 1-3, the surface region (b) being copper polyamate.

EXAMPLE 2

Example 1 was repeated exactly as set forth, except in this example the ion exchange cation solution employed was a 0.1 M aqueous lead nitrate solution instead of copper nitrate.

EXAMPLE 3

Example 1 was repeated exactly as set forth, except in this example the ion exchange cation solution employed was a 0.1 M aqueous solution of silver nitrate instead of copper nitrate.

EXAMPLE 4

Example 1 was repeated exactly as set forth, except in this example the ion exchange cation solution employed was a 0.1 M aqueous solution of calcium nitrate instead of copper nitrate.

Each of the treated wafers of Examples 1–4, along with a control wafer prepared as above but with the omission of the cation exchange step, were reactive ion etched using a parallel plate ion etching apparatus and using oxygen as the etching gas. Etching conditions were: gas flow: 100 SCCM; pressure: 50 millitors; power: 500 watts. Etching time for all samples was to endpoint plus 20% with respect to the control.

Results are shown in Table 1. The number in the first column (START) indicates the thickness of the masked cation polyamate layer (the region of polyamic acid under (b) as shown in FIG. 1-3) prior to etching and the number in the second column (END) indicates the thickness of the same layer after etching to endpoint +20%. The amount and percent of this layer etched is also shown, as well as the etch ratio which represents the degree of etching of the unmasked surface of the wafer with respect to the masked surface of the wafer.

The relief structures on the substrate wafers processed in accordance with Examples 1 through 3 are negative, i.e., the image exposed areas are retained. This is depicted in FIGS. 1-4 and 1-5.

TABLE 1

|  | START | END | ETCHED | % ETCHED | ETCH RATIO |
|---|---|---|---|---|---|
| Ex. 1 ($Cu^{++}$) | 4815A | 2050A | 2765A | 57.4 | 1.9:1 |
| Ex. 2 ($Pb^{++}$) | 4530 | 1930 | 2600 | 57.4 | 2.0:1 |
| Ex. 3 ($Ag^+$) | 4605 | 1250 | 3355 | 72.8 | 1.6:1 |
| Ex. 4 ($Ca^{++}$) | 4650 | 0 | 4650 | 100 | 1:1 |

TABLE 1-continued

|  | START | END | ETCHED | % ETCHED | ETCH RATIO |
|---|---|---|---|---|---|
| Control | 4550 | 0 | 4550 | 100 | 1:1 |

The data demonstrates the effective etch resistant properties imparted to the cation rich polyamate layer as a consequence of the reaction of the copper, lead and silver polyamate surface with the oxygen gas etchant. This is contrasted with the control and the calcium polyamate treatment which is not sufficiently reactive with oxygen to impart effective etch resistance.

Yet another embodiment of the present invention is illustrated in FIGS. 1-6 and 1-7. In this embodiment, the wafer structure is exposed, developed and treated with the ion exchange cation solution as set forth in Example 1 and as illustrated in FIGS. 1-1, 1-2, and 1-3. However, the next step in this embodiment is to strip away the remaining portion of resist layer 12 to expose the remaining surface of polyamic acid layer as shown in FIG. 1-6. This stripping may be accomplished by soaking the wafer in a material which will dissolve resist layer 12 but leave the underlying polyamic acid layer essentially intact, such as by soaking in N-butylacetate for 2 to 3 minutes. This structure is then once again contacted with an aqueous solution of metal cations which is of a different species than that employed in forming the polyamate layer (b) in FIG. 1-3. This results in a structure as shown in FIG. 1-7 having polyamate surface layer (b) and surface layers (c) indicated by the shaded areas on the surface of layer 11.

By selecting an etching gas which is reactive with only polyamate layer (b) or polyamate layer (c) and etching in the normal fashion, positive or negative relief structures may be obtained. For example, using oxygen as the etching gas, a negative relief structure similar to that depicted in FIGS. 1-4 and 1-5 may be obtained where the polyamate salt comprising regions (c) in FIG. 1-7 is the calcium salt or another salt non-reactive with oxygen and the polyamate salt comprising region (b) in FIG. 1-7 is copper, nickel, silver, or another species which is reactive with oxygen and provides RIE barrier properties as described herein. A positive relief structure analogous to that depicted in FIGS. 2-8 and 2-9 may be obtained by simply reversing the ion species contacted with polyamate layer 11, i.e., by using calcium ions or some other species which is not reactive with the oxygen etch to form the metal polyamate salt in region (b) of FIG. 1-7, and using a different metal ion reactive with the oxygen etch to form the metal polyamate salt in regions (c) of FIG. 1-7. Thus, positive or negative relief structures may be made as a function of both the particular etch gas employed and the identity of the salt forming metal cation used to create polyamate regions (b) and (c).

Yet another embodiment of this invention is illustrated in FIGS. 2-1, 2-2, 2-3, 2-4, 2-5, and 2-6. The structure shown in FIG. 2-1 may be of the same composition as that shown in FIG. 1-1.

Resist layer 12 is then exposed to radiation through a mask to provide the exposed region indicated by the shaded area of layer 12 in FIG. 2-2. The structure is then developed using a developer which not only removes the exposed portion of resist layer 12 but also removes the portion of the polyamic acid layer underlying the exposed resist layer as depicted in FIG. 2-3 Removal of both layers may be accomplished by treatment with an aqueous base such as tetramethylammonium hydroxide as set forth in example 1, except that the contact time of the structure with the developer solution is longer, e.g., 2 minutes instead of 50 seconds.

The structure of FIG. 2-3 may then be contacted with the aqueous cation solution as set forth above which will give rise to a structure wherein only side wall diffusion and ion exchange takes place. This is illustrated by the shaded areas in layer 11 shown in FIG. 2-4. Reactive ion etching of this structure then gives rise to a relief structure composed of very thin durable pillars which are suitable for micro imaging as shown in FIG. 2-5 and 2-6.

In a further embodiment of this invention, positive relief structures may be obtained as depicted in FIGS. 2-1, 2-2, 2-3, 2-7, 2-8, and 2-9. In this embodiment, a relief structure is prepared as set forth above and as depicted in FIG. 2-3. Resist layer 12 is next stripped away such as by soaking the structure in N-butylacetate for 2 to 3 minutes as set forth above, leaving exposed the surfaces of polyamic acid layer 11 as shown in FIG. 2-7. The structure is then contacted with the aqueous solution of cations causing the polyamate barrier salt to form on both the inner and top portions of polyamic acid layer 11 as shown by the shaded areas of FIG. 2-8.

The structure is then subjected to reactive ion etching under conditions sufficient to remove the exposed portions of substrate 10 while leaving both the masked area of polyamic acid layer 11 and underlying substrate 9 substantially intact. A positive relief structure as shown in FIG. 2-9 results.

Although variations are shown in the present application, many modifications will occur to those skilled in the art upon reading the present disclosure. These also are intended to be included herein.

I claim:

1. A method of forming an RIE etch barrier comprising the steps of:
    (a) applying a layer comprising an organic polymer resin to a substrate, said organic polymer resin containing functional groups capable of reacting with metal ions;
    (b) applying a film of polymeric resist material to said layer;
    (c) imagewise exposing and developing said film so as to selectively expose portions of said polymer layer;
    (d) contacting said exposed portions of said polymer layer with a solution containing metal ions to incorporate said ions into said exposed portions; and
    (e) exposing the system to reactive ion etching using an etch gas reactive with said ions to uncover portions of the substrate and thereby generate a masked relief structure which can be used to image the substrate.

2. The method of claim 1 wherein said organic polymer is a polyamic acid.

3. The method of claim 2 wherein said substrate is a silicon wafer.

4. The method of claim 2 wherein said polyamic acid is the reaction product of aromatic dianhydride and an aromatic diamine.

5. The method of claim 2 wherein said resist material is positive acting.

6. The method of claim 2 wherein said reactive ion etching step utilizes a gaseous etchant comprising oxygen.

7. The method of claim 2 wherein said reactive ion etching step utilizes a gaseous etchant comprising halogen.

8. The method of claim 2 wherein said solution containing metal cations has a pH ranging from about 3.5 to about 7.0.

9. The method of claim 7 wherein said gaseous etchant is selected from the group consisting of halogen, $CX_4$, $C_2X_6$, $CFCl_3$, $CF_3Cl$, $SX_6$, $CCl_2F_2$, and $NX_3$, wherein X is halogen.

10. The method of claim 9 wherein X is Cl or F.

11. The method of claim 2 wherein said metal ions are alkaline earth or heavy metal ions selected from Groups IIA or IB of the Periodic Table.

12. The method of claim 2 wherein said metal ions are selected from the group consisting of calcium, magnesium, barium, strontium, lead, zinc, cobalt, copper, silver, nickel, titanium, chromium, and manganese.

13. The method of claim 2 further including the step between step (d) and step (e) comprising stripping away the undeveloped areas of said resist film and contacting the thus exposed portions of said polymer layer with a solution containing metal ions of different species from the ions employed in step (d), one of said species of ions being reactive with said etch gas and the other of said species of ions being substantially non-reactive with said etch gas.

14. The method of claim 2 wherein said developing step (c) is sufficient to develop both the resist film layer and the underlying polymer layer.

15. The method of claim 14 further including the step between step (c) and step (d) comprising stripping away the undeveloped areas of said resist film.

16. A relief structure prepared by the method of claim 1.

17. The relief structure of claim 16 wherein said organic polymer layer is a polyamic acid.

* * * * *